United States Patent
Do et al.

(10) Patent No.: US 8,059,778 B1
(45) Date of Patent: *Nov. 15, 2011

(54) AUTOMATIC CLOCK FREQUENCY ACQUISITION

(75) Inventors: Viet Linh Do, Carlsbad, CA (US); Mehmet Mustafa Eker, San Marcos, CA (US); Simon Pang, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/755,292

(22) Filed: Apr. 6, 2010

Related U.S. Application Data

(63) Continuation of application No. 11/595,012, filed on Nov. 9, 2006, now Pat. No. 7,720,189.

(51) Int. Cl.
*H03D 3/24* (2006.01)
(52) U.S. Cl. .......................................... 375/376; 331/11
(58) Field of Classification Search .................. 375/376, 375/373; 331/11
See application file for complete search history.

(56) References Cited

U.S. PATENT DOCUMENTS

| | | | |
|---|---|---|---|
| 6,292,065 B1 * | 9/2001 | Friedman et al. | 331/117 R |
| 7,102,446 B1 * | 9/2006 | Lee et al. | 331/11 |
| 7,720,189 B2 * | 5/2010 | Do et al. | 375/376 |
| 2008/0095291 A1 * | 4/2008 | Cafaro et al. | 375/373 |

* cited by examiner

*Primary Examiner* — Khanh C Tran
*Assistant Examiner* — David Huang
(74) *Attorney, Agent, or Firm* — Law Office of Gerald Maliszewski; Gerald Maliszewski

(57) ABSTRACT

A system and method are provided for automatically acquiring a serial data stream clock. The method receives a serial data stream with an unknown clock frequency and coarsely determines the clock frequency. The frequency is coarsely determined by (initially) selecting a high frequency first reference clock (Fref1), and counting the number of data transitions in a first time segment of the serial data stream at a plurality of sample frequencies equal to Fref1/n, where n is an integer $\geq 1$. The count for each sampling frequency is compared to the count for Fref1 (n=1). Next, the highest sampling frequency (n=x) is determined, which has a lower count than Fref1, and the coarse clock frequency is set to Fc1=Fref1/(x−1).

25 Claims, 4 Drawing Sheets

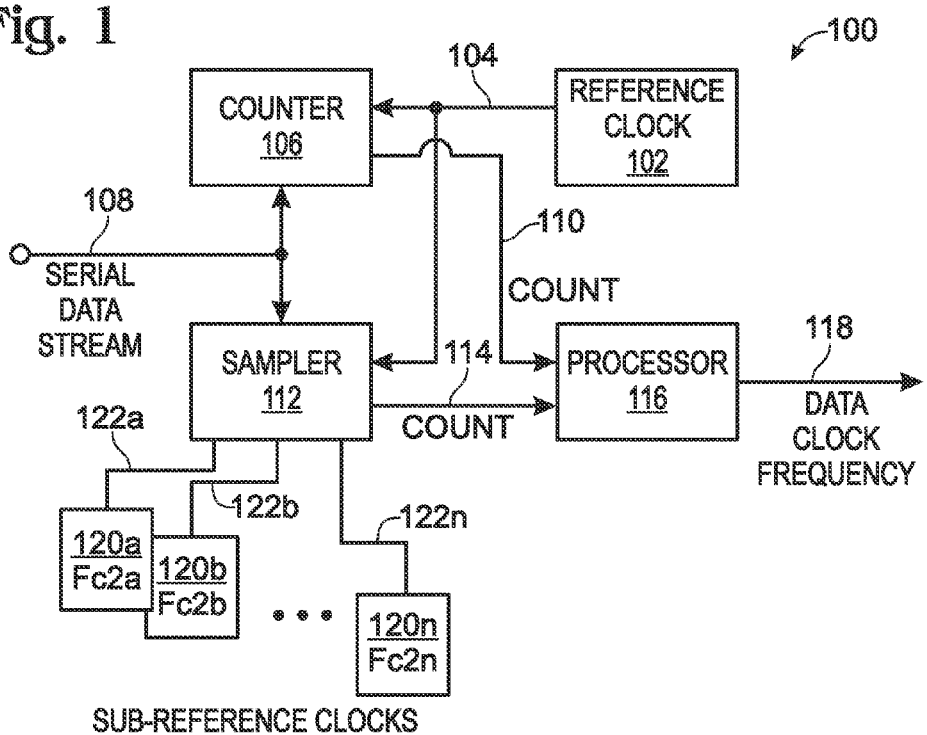
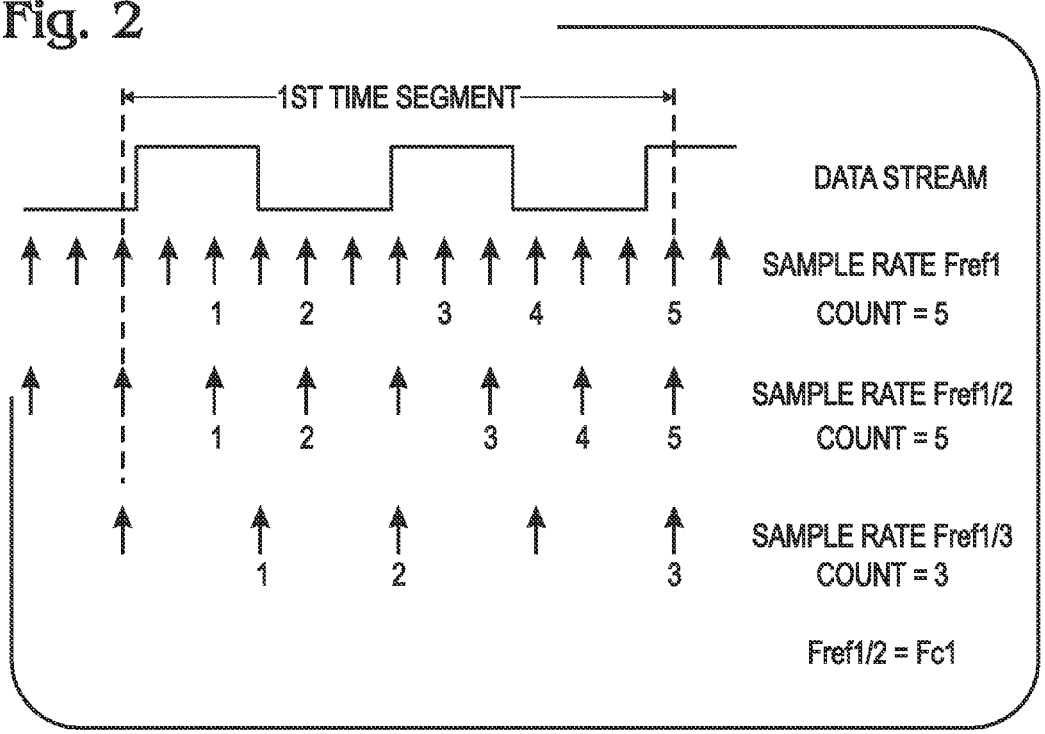

AUTOMATIC CLOCK FREQUENCY ACQUISITION

RELATED APPLICATIONS

This application is a Continuation of a patent application entitled, SYSTEM AND METHOD FOR AUTOMATIC CLOCK FREQUENCY ACQUISITION, invented by Viet Do et al, Ser. No. 11/595,012, filed Nov. 9, 2006 now U.S. Pat. No. 7,720,189, which is incorporated herein by reference.

BACKGROUND OF THE INVENTION

1. Field of the Invention

This invention generally relates to digital communications and, more particularly, to a system and method for determining and acquiring the clock frequency of a serial data stream.

2. Description of the Related Art

Digital high-speed communications, either electrical or optical, such as those compliant with the Synchronous Optical Network (SONET) or Synchronous Digital Hierarchy (SDH) standards, are enabled using a serial data stream. To recover the serial data stream at a receiver, the clock frequency of the received data must first be detected. Typically, the approximate frequency of the serial data stream is known. One common method of providing a data clock is to use a phase-locked loop (PLL) with a voltage controlled oscillator (VCO) to acquire the frequency, and then the phase of the received data.

Voltage controlled ring oscillators are commonly used in monolithic clock data recovery (CDR) units, as they are easy to fabricate and provide reliable results. Voltage controlled ring oscillators can, and usually do exhibit a tuning range much wider than the closed loop PLL bandwidth of the circuits in which they operate.

Clock recovery phase-locked loops (PLLs) generally don't use phase-frequency detectors (PFDs) in the data path since the incoming data signal isn't deterministic. PFDs are more typically used in frequency synthesizers with periodic (deterministic) signals. Clock recovery PLLs use exclusive-OR (XOR)-based phase detectors to maintain quadrature phase alignment between the incoming data pattern and the re-timed pattern. XOR-based phase detectors have a limited frequency discrimination capability, generally restricting frequency offsets to less than the closed loop PLL bandwidth. This characteristic, coupled with the wide tuning range of the VCO, requires CDR circuits to depend upon an auxiliary frequency acquisition system.

There are two basic PLL frequency acquisition techniques. The first is a VCO sweep method. During an out-of-lock condition, auxiliary circuits cause the VCO frequency to slowly sweep across its tuning range in search of an input signal. The sweeping action is halted when a zero-beat note is detected, causing the PLL to lock to the input signal. The VCO sweep method is generally used in microwave frequency synthesis applications. The second type of acquisition aid, commonly found in clock recovery circuits, uses a PFD in combination with an XOR phase detector. When the PLL isn't locked to a data stream, the PLL switches over to a PFD that is driven by a stable reference clock source. The reference clock frequency is approximately equal to the data stream rate. Thus, the VCO frequency is held very close to the data rate. Keeping the VCO frequency in the proper range of operation facilitates acquisition of the serial data and maintains a stable downstream clock when serial data isn't present at the CDR input. When serial data is applied to the CDR, the XOR based phase detector replaces the PFD, and data re-timing resumes.

However, serial data streams may be clocked at a number of frequencies, depending upon the communication protocol. Due to the PLL constraints mentioned above, a typical receiver is designed to operate at one particular data clock rate. Thus, a conventional receiver necessarily has a limited use. Even if the frequency of use can be selected from a range of potential frequencies, the actual operating frequency that is selected must be pre-programmed.

It would be advantageous if a synchronous serial data stream receiver could be made to operate at a number of different clock rates, without the preliminary step of pre-programming the operating frequency.

It would be advantageous if a synchronous serial data stream receiver could automatically determine the frequency of a received data stream and supply an appropriate data clock to recover the signal.

SUMMARY OF THE INVENTION

Accordingly, a method is provided for automatically acquiring a serial data stream clock. The method receives a serial data stream with an unknown clock frequency and coarsely determines the clock frequency. A phase-locked loop (PLL) is adjusted in response to the coarsely determined clock frequency, and the serial data stream is supplied to the PLL as an input signal. The PLL acquires the clock frequency, tracks the phase of the acquired clock frequency, and supplies a recovered data clock. The spurious and harmonically-related products of the recovered data clock are sufficiently attenuated to be compliant with the stringent Synchronous Optical Network (SONET) and Synchronous Digital Hierarchy (SDH) standards.

The frequency is coarsely determined by, initially, selecting a high frequency first reference clock (Fref1), and counting the number of data transitions in a first time segment of the serial data stream at a plurality of sample frequencies equal to Fref1/n, where n is an integer $\geq 1$. The count for each sampling frequency is compared to the count for Fref1 (n=1). Next, the highest sampling frequency (n=x) is determined, which has a lower count than Fref1, and the coarse clock frequency is set to Fc1=Fref1/(x−1).

The coarse frequency is finally determined by selecting a plurality of sub-reference clocks, the combination of which covers the frequency band between Fref1/x and Fref1/(x−1). Data transitions in the first time segment of the serial data stream are counted at the plurality of sub-reference clock frequencies and compared to the count for Fref1. The lowest frequency sub-reference clock (Fc2) having a count equal to Fref1 is selected and the final coarse clock frequency is set to Fc2.

Additional details of the above-described method and a corresponding system for acquiring an unknown serial data stream clock frequency are provided below. Further, details of a system and method are provided for comparing the frequency of a serial data stream to a reference clock frequency, are provided below.

BRIEF DESCRIPTION OF THE DRAWINGS

FIG. 1 is a schematic block diagram of a system for comparing a serial data stream to a reference clock.

FIG. 2 is a diagram graphically depicting the selection of Fc1.

DETAILED DESCRIPTION

Figure 3:
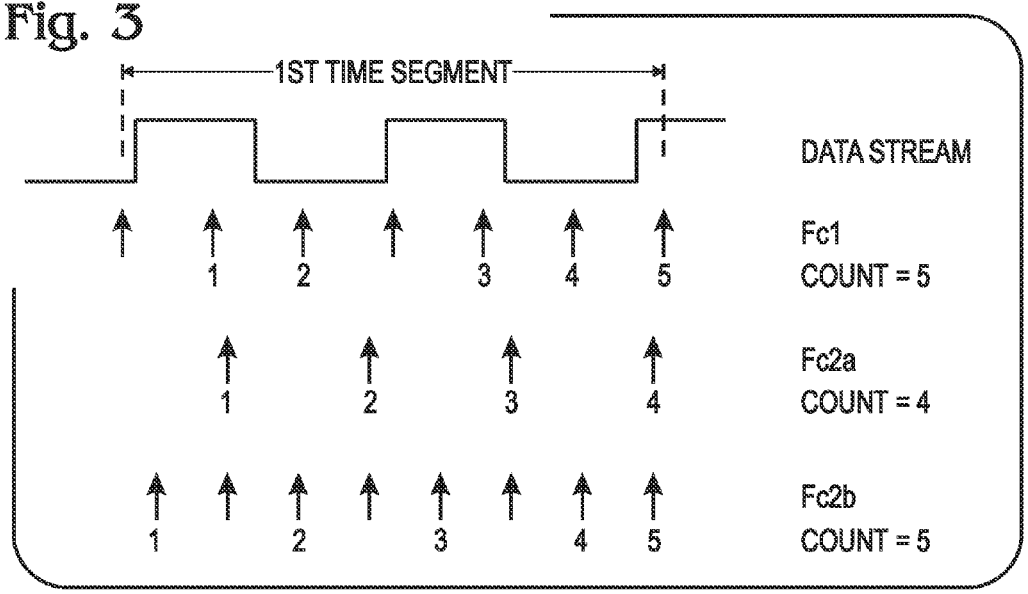
FIG. 3 is a diagram graphically depicting the process for determining Fc2.

FIG. 1 is a schematic block diagram of a system for comparing a serial data stream to a reference clock. The system 100 comprises a reference clock 102 having an output on line 104 to supply a reference clock frequency. A counter 106 has an input on line 108 to receive a serial data stream, and an output on line 110 to supply a count of transitions in the data stream. For example, the serial data stream on line 108 may be SONET, Gigabit Ethernet (GBE), Fibre Channel (FC), D1 Video, DTV, DV6000-1, HDTV, ESCON/FICON, digitally wrapped data, video, or FDDI.

A sampler 112 has an input on line 108 to receive the serial data stream, an input connected to the reference clock output on line 104, and an output on line 114 to supply a count of transitions in the data stream sampled at a reference clock frequency. A processor 116 has an input on line 114 to accept the count from the sampler 112, an input on line 110 to accept the count from the counter 106, and an output on line 118 to supply the data stream clock frequency calculated in response to comparing the counts.

In one aspect, the reference clock 102 outputs a high frequency first clock frequency (Fref1) on line 104, which is received by the counter 106. The counter supplies a count of transitions in the data stream during a first time segment, responsive to Fref1. In this aspect, it is assumed that Fref1 is greater than, or equal to the frequency of the input data stream. In a different aspect (not shown), the counter may be a register, such as a flip-flop, with Q and Q-bar inputs tied to a fixed voltage, with the data stream on line 108 tied to a clock input. Assuming that register has a sufficient high frequency response, an accurate count of data transitions can be obtained by dividing the register output by a factor of 2. However, the invention is not limited to any particular method for obtaining an accurate count of data transitions.

The task of the sampler 112 is to count the number of transitions in the data stream during the first time segment, at a plurality of sample frequencies equal to Fref1/n, where n is an integer $\geq 1$. For simplicity, whole number integers are used as an example. However, the invention could also be enabled using non-whole integers for values of n. Generally, the task of the processor 116 is to find the lowest frequency sampling clock that provides an accurate count. Here it is assumed that the count provided by the counter 106 is accurate. Thus, the processor 116 compares the count for each sampling frequency, to the count for Fref1 (n=1), which is the count provided by counter 106. The processor 116 determines the highest sampling frequency (n=x) having a lower count than Fref1, and initially sets the data clock frequency to Fc1=Fref1/(x-1). Alternately stated, the processor 116 compares counts, as the sampling rate clock is incrementally lowered in frequency. When the count varies from the known accurate count, the sampling rate is assumed to be too low, and the sampling rate clock next highest in frequency is selected as Fc1. Note: the processor may make data transition counts and comparisons serially, using different data stream time segments. Alternately, a plurality of sampling rates may be measured in parallel using the same data stream time segment.

FIG. 2 is a diagram graphically depicting the selection of Fc1. Shown is a serial data stream. The data stream is sampled at the rate Fref1 (n=1), during a first time segment, and 5 data transitions are counted. The data stream is sampled in the same time segment using a sample rate of Fref1/2 (n=2), and 5 data transitions are counted. However, when the sampling rate is reduced to Fref1/3 (n=3), a count of 3 is obtained. So the sampling rate is known to be too low, and x=3. Therefore, Fc1 is set to Fref1/(x-1), or Fref1/2.

Returning to FIG. 1, once the data stream clock is initially determined, a subsequent process may be engaged to more finely determine the frequency. In this aspect, a plurality of sub-reference clocks 120 is used. Shown are clocks 120a, 120b, and 120n. However, n is not limited to any particular number. The combination of sub-reference clock output frequencies covers the frequency band between Fref1/x and Fref1/(x-1). The sampler 112 counts the number of data transitions in the first time segment of the serial data stream at the plurality of sub-reference clock frequencies. Note: the counted data transitions need not necessarily be from the first time segment. Further, it is not always necessary to measure each sub-reference clock. In one aspect, all the data transitions may be counted in a different (subsequent) time segment. The processor 116 compares the counts for each sub-reference clock to the count for Fref1, determines the lowest frequency sub-reference clock (Fc2) having a count equal to Fref1, and sets the final coarse clock frequency to Fc2.

In one aspect, the plurality of sub-reference clocks 120 are tunable sub-reference clocks, the combination of which can be tuned to cover the frequency band between Fref1/x and Fref1/(x-1). For example, the sub-reference clocks may be voltage tunable oscillators (VCOs). The sampler 112 counts data transitions for each sub-reference clock tuned to the low end of its frequency sub-band, and the processor 116 determines the highest frequency sub-reference clock (Fc2) having a lower count than Fref1. It is assumed that the selected sub-reference clock Fc2 can be tuned in subsequent processes to the exact serial data stream frequency.

FIG. 3 is a diagram graphically depicting the process for determining Fc2. The data stream is sampled at the rate Fc1, which is Fref1/2, see FIG. 2. During the first time segment, 5 data transitions are counted (as in FIG. 2). The data stream is sampled in the same time segment using a sub-reference clock Fc2a, and 4 data transitions are counted. Thus, the sampling rate is too slow. Then, the data stream is sampled at Fc2b, which is the next highest frequency sub-reference clock. Here, a count of 5 is obtained, and Fc2b may be used as the final coarse frequency selection. Alternately, if the sub-reference clocks are tunable and the count measurements are performed on the low end of the band, Fc2a may selected, since it can be tuned to the exact data stream frequency, which may be desirable in some aspects of the system.

Using the initial process depicted in FIG. 2, the processor can initially determine the data clock frequency within a tolerance of about +/-100%. Using the process depicted in FIG. 3, the process can finally determine the data clock frequency within a tolerance of about +/-20%. As explained below, a tunable sub-reference clock may be used to determine and track the exact frequency of the data stream.

Figure 4:
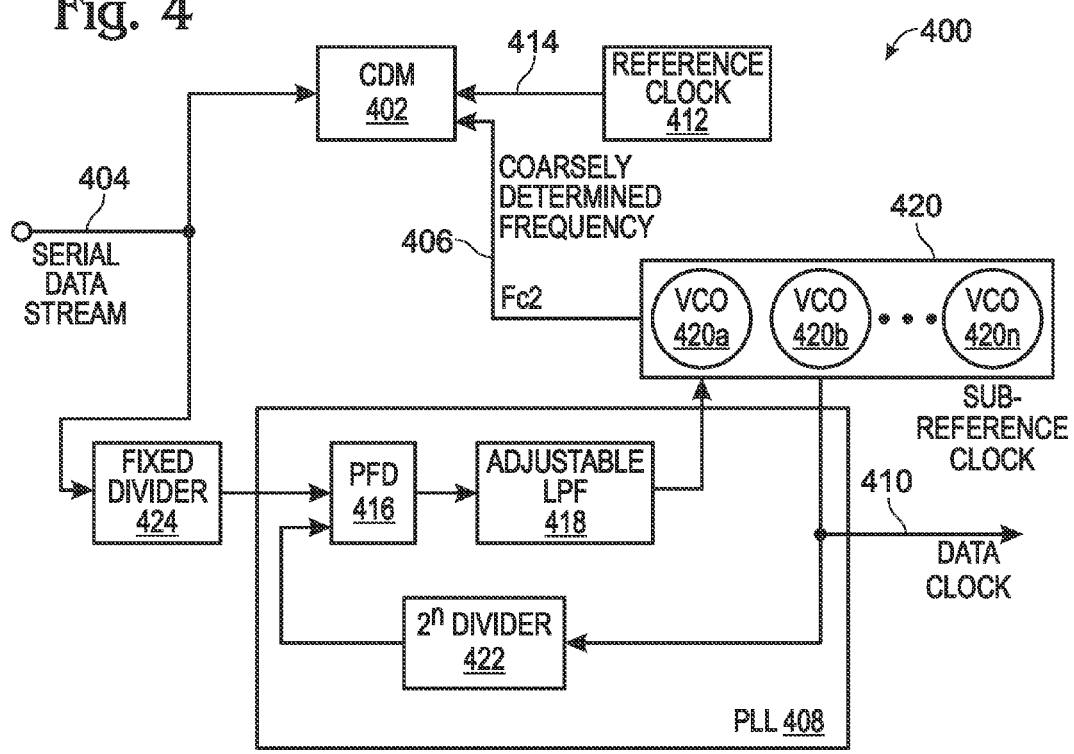
FIG. 4 is a schematic block diagram of a system for automatically acquiring a serial data stream clock.

FIG. 4 is a schematic block diagram of a system for automatically acquiring a serial data stream clock. The system 400 comprises a coarse frequency determination module (CDM) 402 having an input on line 404 to receive a serial data stream with an unknown clock frequency and an output on line 406 to supply a coarsely determined measurement of the clock frequency. A phase-locked loop (PLL) 408 has an input on line 404 to accept the serial data stream and an input on line 406 to receive the coarsely determined measurement of clock frequency. The PLL 408 acquires the clock frequency, tracks the phase of the acquired clock frequency, and supplies a recovered data clock at an output on line 410.

The CDM 402 is essentially the system of FIG. 1, and a complete description of the CDM is not repeated here in the interest of brevity. The CDM 402 initially determines the coarse clock frequency using a first sampling measurement and supplies a finally determined coarse clock frequency using a second sampling measurement, as described in detail above.

The system 400 may further comprise a reference clock 412 having an output on line 414 to supply a high frequency first reference clock frequency Fref1. The CDM 402 has an input connected to the reference clock output on line 414. The CDM 402 initially determines the coarse clock frequency by counting the number of data transitions in a first time segment of the serial data stream at a plurality of sample frequencies equal to Fref1/n, where n is an integer $\geq 1$, and comparing the count for each sampling frequency, to the count for Fref1 (n=1). A determination is made to find the highest sampling frequency (n=x) having a lower count than Fref1, and the coarse clock frequency to Fc1 is set equal to Fref1/(x−1), see FIG. 2.

More specifically, the CDM 402 provides a coarsely determined frequency in the selection of a particular sub-reference clock frequency. As shown, the sub-reference clock 420 actually includes a plurality of sub-reference clocks. Shown are sub-reference clocks 420a, 420b, and 420n, where n is not limited to any particular number. The combination of sub-reference clocks 420 covers the frequency band between Fref1/x and Fref1/(x−1). The CDM 402 finally determines the coarse clock frequency by counting the number of data transitions in the first time segment of the serial data stream at the plurality of sub-reference clock frequencies. The CDM 402 compares the count for each sub-reference clock to the count for Fref1, determines the lowest frequency sub-reference clock (Fc2) having a count equal to Fref1, and sets the final coarse clock frequency to Fc2.

As shown, the plurality of sub-reference clocks 420 are tunable sub-reference clocks, such as VCOs, the combination of which can be tuned to cover the frequency band between Fref1/x and Fref1/(x−1). The CDM 402 counts the number of data transitions in the first time segment of the serial data stream at the plurality of sub-reference clock frequencies by tuning each sub-reference clock to the low end of its frequency sub-band and counting data transitions. The highest frequency sub-reference clock having a lower count than Fref1 is determined to be Fc2.

As noted earlier, the CDM 402 initially determines the coarse clock frequency within a tolerance of about +/−100%, and finally determines the coarse clock frequency within a tolerance of about +/−20%.

The PLL 408 includes a phase-frequency detector (PFD) 416, an adjustable-pole low-pass loop filter (LPF) 418, the selected sub-reference clock (Fc2) 420, and a $2^n$ frequency divider 422. In response to selecting the tunable sub-reference clock (Fc2) 420, the PLL 408 selects the bandwidth of the low-pass loop filter 418 and a fraction division ratio of the frequency divider 422. In some aspects, a fixed divider 424 may be inserted in the serial data stream path to the PDF 416, to lower the PDF comparison frequency.

Functional Description

Figure 5:
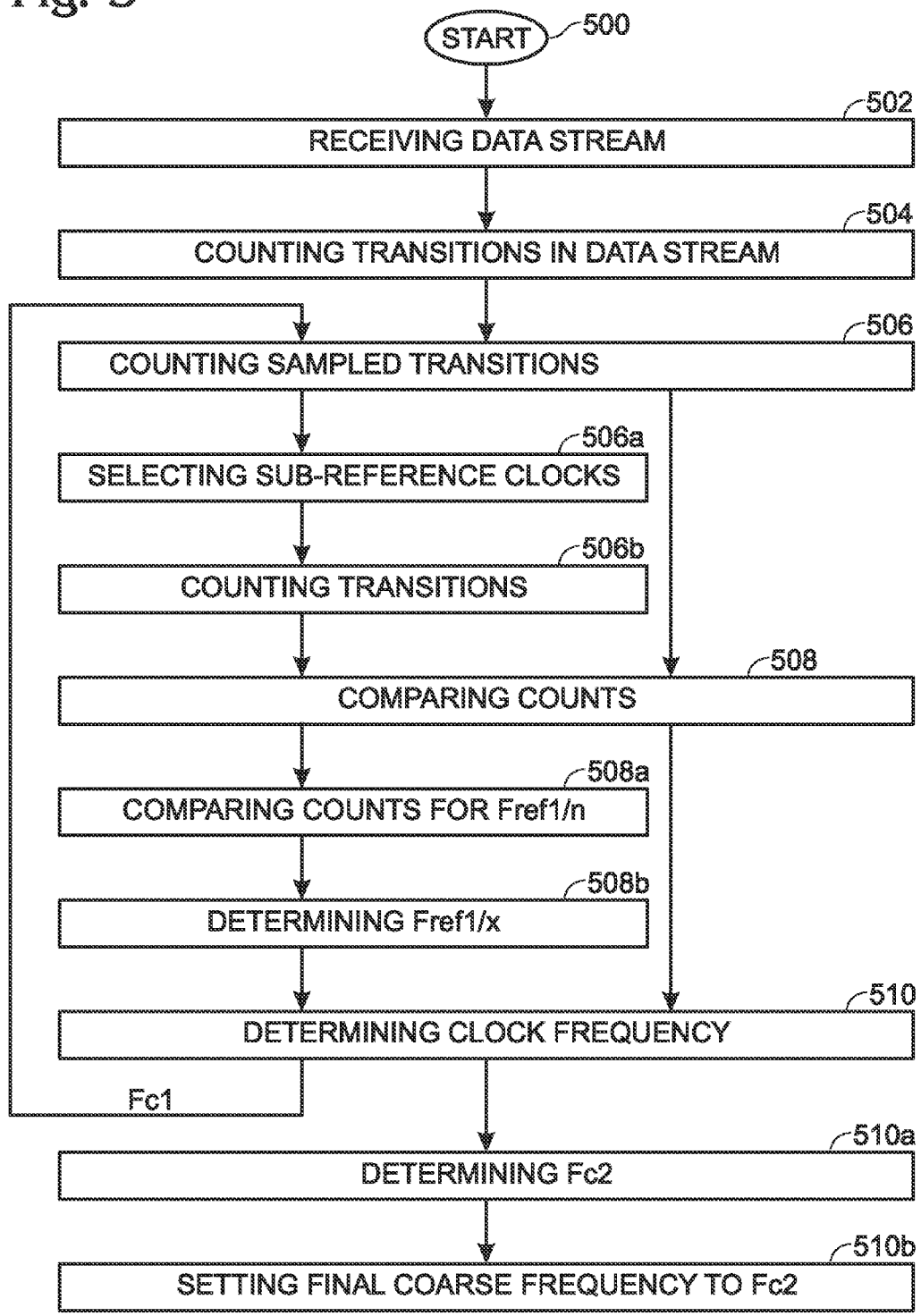
FIG. 5 is a flowchart illustrating a method for comparing the frequency of a serial data stream to a reference clock frequency.

FIG. 5 is a flowchart illustrating a method for comparing the frequency of a serial data stream to a reference clock frequency. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 500.

Step 502 receives a serial data stream. Step 504 counts the number of transitions in a first time segment of the data stream. Step 506 counts the number of transitions in the first time segment of the data stream sampled at a reference clock frequency. Step 508 compares the counts, and Step 510 determines the data stream clock frequency in response to the count comparison.

In one aspect, counting the number of transitions in the first segment of the data stream in Step 504 includes counting the number of transitions sampled at a high frequency first clock (Fref1). Counting the number of transitions in the first segment of the data stream sampled at the reference clock frequency (Step 506) includes counting the number of transitions in the data stream at a plurality of sample frequencies equal to Fref1/n, where n is an integer $\geq 1$. Then, comparing the counts includes substeps. Step 508a compares the count for each sampling frequency, to the count for Fref1 (n=1). Step 508b determines the highest sampling frequency (n=x) having a lower count than Fref1. Step 510 initially sets the data stream clock frequency to Fc1=Fref1/(x−1).

In a different aspect, counting the number of transitions in Step 506 includes substeps. Subsequent to initially setting the data stream clock frequency to Fc1 (Step 510), Step 506a selects a plurality of sub-reference clocks, the combination of which covers the frequency band between Fref1/x and Fref1/(x−1). Step 506b counts the number of data transitions in the first time segment of the serial data stream at the plurality of sub-reference clock frequencies. Comparing the counts in Step 508 includes comparing the counts for each sub-reference clock to the count for Fref1. Then, determining the data stream clock frequency in Step 510 includes substeps. Step 510a determines the lowest frequency sub-reference clock (Fc2) having a count equal to Fref1. Step 510b sets the final coarse clock frequency to Fc2.

In another aspect, selecting the plurality of sub-reference clocks in Step 506a includes selecting a plurality of tunable sub-reference clocks, the combination of which can be tuned to cover the frequency band between Fref1/x and Fref1/(x−1). Counting the number of data transitions in the first time segment of the serial data stream at the plurality of sub-reference clock frequencies in Step 506b includes tuning each sub-reference clock to the low end of its frequency sub-band, and counting data transitions. Then, determining the lowest frequency sub-reference clock (Fc2) having a count equal to Fref1 in Step 510a includes determining the highest frequency sub-reference clock having a lower count than Fref1.

Step 510 initially determines the data stream clock frequency within a tolerance of about +/−100%, and finally determines the data stream clock frequency within a tolerance of about +/−20%.

Figure 6:
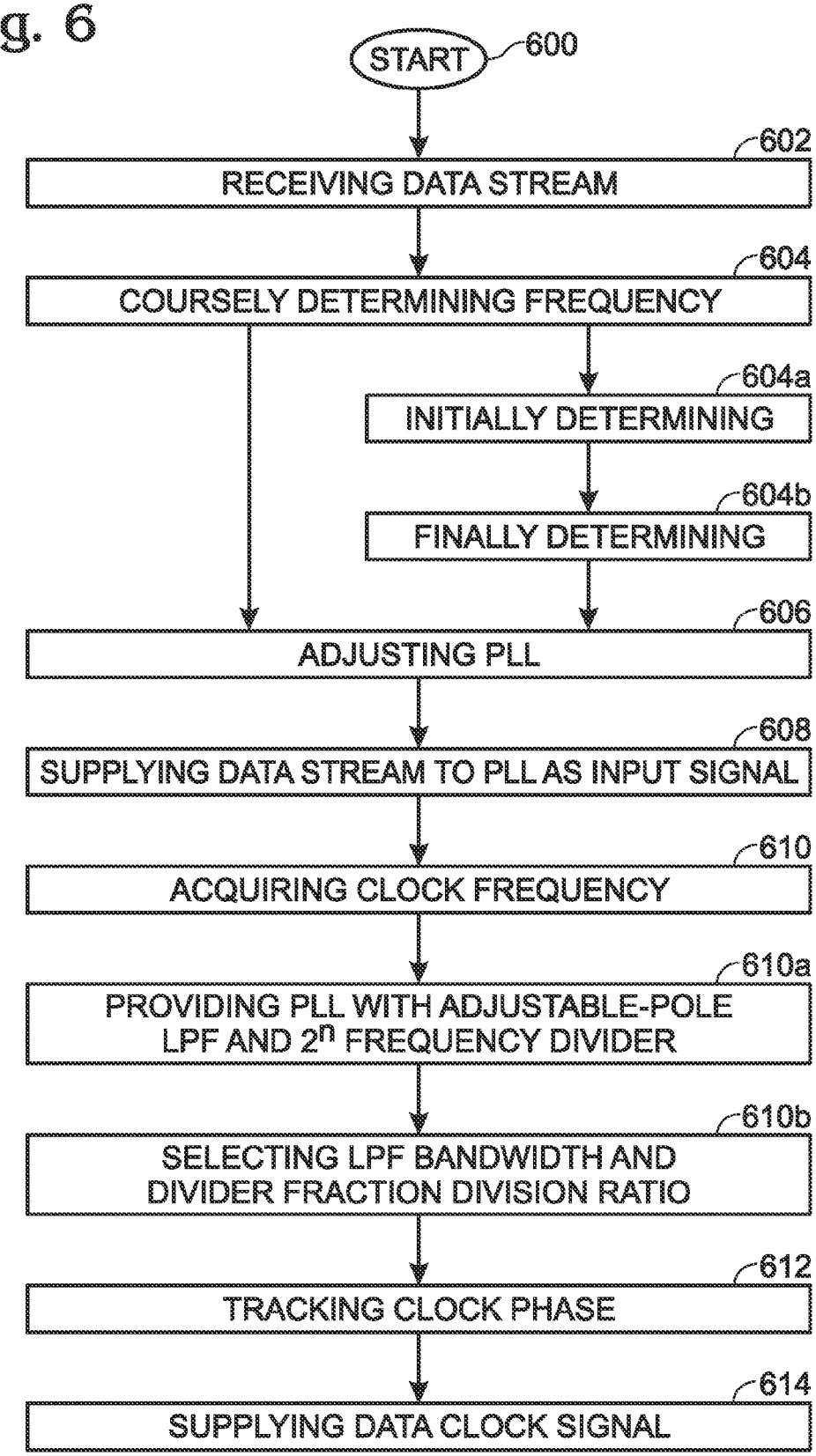
FIG. 6 is a flowchart illustrating a method for automatically acquiring a serial data stream clock.

FIG. 6 is a flowchart illustrating a method for automatically acquiring a serial data stream clock. The method starts with Step 600. Step 602 receives a serial data stream with an unknown clock frequency. Step 604 coarsely determines the clock frequency. Step 606 adjusts a phase-locked loop (PLL) in response to the coarsely determined clock frequency. Step 608 supplies the serial data stream to the PLL as an input signal. Using the PLL, Step 610 acquires the clock frequency. Step 612 tracks the phase of the acquired clock frequency. Step 614 supplies a recovered data clock. In one aspect, Step 614 supplies a clock signal compliant to synchronous optical network (SONET) and Synchronous Digital Hierarchy (SDH) standards.

In another aspect, coarsely determining the clock frequency in Step 604 includes substeps. Step 604a initially determines the coarse clock frequency using a first sampling measurement. Step 604b finally determines the coarse clock frequency using a second sampling measurement. In one aspect, Step 604a determines the initial coarse clock frequency within a tolerance of about +/−100%, and Step 604b determines the final coarse clock frequency within a tolerance of about +/−20%.

Initially determining the coarse clock frequency using the first sampling measurement includes additional substeps not shown (see FIG. 5). Step 604a1 selects a high frequency first reference clock (Fref1). Step 604a2 counts the number of data transitions in a first time segment of the serial data stream at a plurality of sample frequencies equal to Fref1/n, where n is an integer $\geq 1$. Step 604a3 compares the count for each sampling frequency, to the count for Fref1 (n=1). Step 604a4 determines the highest sampling frequency (n=x) having a lower count than Fref1. Step 604a5 sets the coarse clock frequency to Fc1=Fref1/(x−1).

Likewise, finally determining the coarse clock frequency using the second sampling measurement includes substeps not shown (see FIG. 5). Step 604b1 selects a plurality of sub-reference clocks, the combination of which covers the frequency band between Fref1/x and Fref1/(x−1). Step 604b2 counts the number of data transitions in the first time segment of the serial data stream at the plurality of sub-reference clock frequencies. Step 604b3 compares the count for each sub-reference clock to the count for Fref1. Step 604b4 determines the lowest frequency sub-reference clock (Fc2) having a count equal to Fref1. Step 604b5 sets the final coarse clock frequency to Fc2.

In one aspect, selecting the plurality of sub-reference clocks in Step 604b1 includes selecting a plurality of tunable sub-reference clocks, the combination of which can be tuned to cover the frequency band between Fref1/x and Fref1/(x−1). Then, counting the number of data transitions in the first time segment of the serial data stream at the plurality of sub-reference clock frequencies in Step 604b2 includes tuning each sub-reference clock to the low end of its frequency sub-band, and counting data transitions. Determining the lowest frequency sub-reference clock (Fc2) having a count equal to Fref1 in Step 604b4 includes determining the highest frequency sub-reference clock having a lower count than Fref1.

In another aspect, acquiring the clock frequency in Step 610 includes substeps. Step 610a provides a PLL with a phase-frequency detector (PFD), an adjustable-pole low-pass loop filter, a voltage controlled oscillator (VCO), and a $2^n$ frequency divider. In response to coarsely determining the clock frequency, Step 610b selects the bandwidth of the low-pass loop filter, and a fraction division ratio of the frequency divider.

A system and method have been provided for coarsely determining, and then tracking the data clock associated with a serial stream of data. Some examples have been given as to how a frequency can be coarsely determined using a sampling process. However, the invention is not limited to just these examples. Other variations and embodiments of the invention will occur to those skilled in the art.

We claim:

1. A method for automatically acquiring a serial data stream clock, the method comprising:

receiving a serial data stream with an unknown clock frequency within a combined frequency band covered by a plurality of selectable sub-reference clocks;

coarsely determining the clock frequency;

selecting a sub-reference clock in response to coarsely determining the clock frequency;

adjusting a phase-locked loop (PLL) in response to the selected sub-reference clock:

supplying the serial data stream to the PLL as an input signal;

using the PLL, acquiring the clock frequency;

tracking a phase of the acquired clock frequency; and, supplying a recovered data clock.

2. The method of claim 1 wherein supplying the recovered data clock includes supplying a clock signal compliant to synchronous optical network (SONET) and Synchronous Digital Hierarchy (SDH) standards.

3. The method of claim 1 wherein coarsely determining the clock frequency includes:

initially determining the coarse clock frequency using a first sampling measurement; and, finally determining the coarse clock frequency using a second sampling measurement.

4. The method of claim 3 wherein initially determining the coarse clock frequency using the first sampling measurement includes:

selecting a high frequency first reference clock (Fref1), where Fref1 is a high frequency first clock reference;

counting the number of data transitions in a first time segment of the serial data stream at a plurality of sample frequencies equal to Fref1/n, where n is an integer $\geq 1$;

comparing the count for each sampling frequency, to the count for Fref1 (n=1);

determining the highest sampling frequency Fref1/x (n=x) having a lower count than Fref1; and, setting the coarse clock frequency to Fc1=Fref1(x−1).

5. The method of claim 4 wherein finally determining the coarse clock frequency using the second sampling measurement includes:

selecting the plurality of sub-reference clocks, the combination of which covers the frequency band between Fref1/x and Fref1/(x−1);

counting the number of data transitions in the first time segment of the serial data stream at the plurality of sub-reference clock frequencies;

comparing the count for each sub-reference clock to the count for Fref1;

determining the lowest frequency sub-reference clock (Fc2 having a count equal to Fref1; and, setting the final coarse clock frequency to Fc2.

6. The method of claim 5 wherein selecting the plurality of sub-reference clocks includes selecting a plurality of tunable sub-reference clocks, the combination of which can be tuned to cover the frequency band between Fref1/x and Fref1/(x−1);

wherein counting the number of data transitions in the first time segment of the serial data stream at the plurality of sub-reference clock frequencies includes:

tuning each sub-reference clock to the low end of its frequency sub-band; and counting data transitions; and, wherein determining the lowest frequency sub-reference clock (Fc2) having a count equal to Fref1 includes determining the highest frequency sub-reference clock having a lower count than Fref1.

7. The method of claim 5 wherein coarsely determining the clock frequency includes:

determining the initial coarse clock frequency within a tolerance of about +/−100%; and,
determining the final coarse clock frequency within a tolerance of about +/−20%.

8. The method of claim 5 wherein acquiring the clock frequency includes:
providing a PLL with a phase-frequency detector (PFD), an adjustable-pole low-pass loop filter, the sub-reference clock Fc2, and a 2″ frequency divider; and,
in response to coarsely determining the clock frequency, selecting the bandwidth of the low-pass loop filter, and a fraction division ratio of the frequency divider.

9. A method for comparing the frequency of a serial data stream to a reference clock frequency, the method comprising:
receiving a serial data stream;
counting the number of transitions in a first time segment of the data stream sampled at a high frequency first clock (Fref1);
counting the number of transitions in the first time segment of the data stream sampled at a reference clock frequency having a lower frequency than the first clock (Fref1);
comparing the counts; and,
determining the data stream clock frequency in response to the count comparison.

10. The method of claim 9 wherein counting the number of transitions in the first segment of the data stream sampled at the reference clock frequency includes counting the number of transitions in the data stream at a plurality of sample frequencies equal to Fref1/n, where n is an integer ≧1;
wherein comparing the counts includes:
comparing the count for each of the plurality of sampling frequencies, to the count for Fref1 (n=1);
determining the highest sampling frequency Fref1/x (n=x) having a lower count than Fref1; and,
wherein determining the data stream clock frequency includes initially setting the data stream clock frequency to Fc1=Fref1/(x−1).

11. The method of claim 10 wherein counting the number of transitions in the first segment of the data stream sampled at the reference clock frequency includes:
selecting a plurality of sub-reference clocks, the combination of which covers the frequency band between Fref1/x and Fref1/(x−1);
counting the number of data transitions in the first time segment of the serial data stream at the plurality of sub-reference clock frequencies;
wherein comparing the counts includes comparing the counts for each sub-reference clock to the count for Fref1;
wherein determining the data stream clock frequency includes:
determining the lowest frequency sub-reference clock (Fc2) having a count equal to Fref1; and,
setting the final coarse clock frequency to Fc2.

12. The method of claim 11 wherein selecting the plurality of sub-reference clocks includes selecting a plurality of tunable sub-reference clocks, the combination of which can be tuned to cover the frequency band between Fref1/x and Fref1/(x−1):
wherein counting the number of data transitions in the first time segment of the serial data stream at the plurality of sub-reference clock frequencies includes:
tuning each sub-reference clock to the low end of its frequency sub-band; and
counting data transitions; and, wherein determining the lowest frequency sub-reference clock (Fc2) having a count equal to Fref1 includes determining the highest frequency sub-reference clock having a lower count than Fref1.

13. The method of claim 11 wherein initially determining the data stream clock frequency includes determining the data stream clock frequency within a tolerance of about +/−100%; and,
wherein finally determining the data stream clock frequency includes determining the data stream clock frequency within a tolerance of about +/−20%.

14. A system for automatically acquiring a serial data stream clock, the system comprising:
a plurality of sub-reference clocks covering a combined frequency band;
a coarse determination module (CDM) having an input to receive a serial data stream with an unknown clock frequency within the combined frequency band, and an output to supply a coarsely determined measurement of the clock frequency; and,
a phase-locked loop (PLL) having an input to accept the serial data stream and an input to receive the coarsely determined measurement of clock frequency, the PLL selecting a sub-reference clock in response to receiving the coarsely determined clock frequency measurement, acquiring the clock frequency using the selected sub-reference clock, tracking a phase of the acquired clock frequency, and supplying a recovered data clock at an output.

15. The system of claim 14 wherein the CDM initially determines the coarse clock frequency using a first sampling measurement and supplies a finally determined coarse clock frequency using a second sampling measurement.

16. The system of claim 15 further comprising:
a reference clock having an output to supply a high frequency first reference clock frequency Fref1;
wherein the CDM has an input connected to the reference clock output, the CDM initially determining the coarse clock frequency as follows:
counting the number of data transitions in a first time segment of the serial data stream at a plurality of sample frequencies equal to Fref1/n, where n is an integer ≧1;
comparing the count for each sampling frequency, to a count for Fref1 (n=1);
determining the highest sampling frequency Fref1/x (n=x) having a lower count than Fref1; and,
setting the coarse clock frequency to Fc1=Fref1/(x−1).

17. The system of claim 16 wherein the plurality of sub-reference clocks covers the frequency band between Fref1/x and Fref1/(x−1);
wherein the CDM finally determines the coarse clock frequency as follows;
counting the number of data transitions in the first time segment of the serial data stream at the plurality of sub-reference clock frequencies;
comparing the count for each sub-reference clock to the count for Fref1;
determining the lowest frequency sub-reference clock (Fc2) having a count equal to Fref1; and,
setting the final coarse clock frequency to Fc2.

18. The system of claim 17 wherein the plurality of sub-reference clocks are tunable sub-reference clocks, the combination of which can be tuned to cover the frequency band between Fref1/x and Fref1/(x−1);

wherein the CDM counts the number of data transitions in the first time segment of the serial data stream at the plurality of sub-reference clock frequencies as follows:
tuning each sub-reference clock to the low end of its frequency sub-band;
counting data transitions; and,
determining the highest frequency sub-reference clock having a lower count than Fref1.

19. The system of claim 17 wherein the CDM initially determines the coarse clock frequency within a tolerance of about +/−100%, and finally determines the coarse clock frequency within a tolerance of about +/−20%.

20. The system of claim 17 wherein the PLL includes a phase-frequency detector (PFD), an adjustable-pole low-pass loop filter, sub-reference clock Fc2, and a $2^n$ frequency divider, and in response to selecting the sub-reference clock, the PLL selects the bandwidth of the low-pass loop filter and a fraction division ratio of the frequency divider.

21. A system for comparing a serial data stream to a reference clock, the system comprising:
a reference clock having an output to supply a first clock frequency (Fref1) and a reference clock frequency, where the frequency of the first clock frequency (Fref1) is greater than the reference clock frequency;
a counter having an input receive a serial data stream, an input to accept the first clock frequency (Fref1), and an output to supply a reference count of transitions in the data stream sampled at Fref1;
a sampler having an input to receive the serial data stream, an input connected to receive the reference clock frequency, and an output to supply a count of transitions in the data stream sampled at the reference clock frequency; and,
a processor having an input to accept the count from the sampler, the count from the counter, and an output to supply the data stream clock frequency calculated in response to comparing the counts.

22. The system of claim 21 wherein the counter supplies the reference count of transitions in the data stream during a first time segment, sampled at Fref1;
wherein the sampler counts the number of transitions in the data stream during the first time segment, at a plurality of sample frequencies equal to Fref1/n, where n is an integer $\geq 1$; and,
wherein the processor compares the count for each sampling frequency, to the reference count for Fref1 (n=1), determines the highest sampling frequency Fref1/x (n=x) having a lower count than Fref1, and initially sets the data clock frequency to Fc1=Fref1/(x−1).

23. The system of claim 22 further comprising:
a plurality of sub-reference clocks, the combination of which covers the frequency band between Fref1/x and Fref1/(x−1);
wherein the sampler counts the number of data transitions in the e first time segment of the serial data stream at the plurality of sub-reference clock frequencies;
wherein the processor compares the counts for each sub-reference clock to the reference count for Fref1, determines the lowest frequency sub-reference clock (Fc2) having a count equal to Fref1, and sets the final coarse clock frequency to Fc2.

24. The system of claim 23 wherein the plurality of sub-reference clocks are tunable sub-reference clocks, the combination of which can be tuned to cover the frequency band between Fref1/x and Fref1/(x−1);
wherein the sampler counts data transitions for each sub-reference clock tuned to the low end of its frequency sub-band; and
wherein the processor determines the highest frequency sub-reference clock (Fc2) having a lower count than Fref1.

25. The system of claim 23 wherein the processor initially determines the data clock frequency within a tolerance of about +/−100%, and finally determines the data clock frequency within a tolerance of about +/−20%.

* * * * *